US007590249B2

(12) United States Patent
Jang et al.

(10) Patent No.: US 7,590,249 B2
(45) Date of Patent: Sep. 15, 2009

(54) OBJECT-BASED THREE-DIMENSIONAL AUDIO SYSTEM AND METHOD OF CONTROLLING THE SAME

(75) Inventors: Dae-Young Jang, Daejeon (KR); Jeong-Il Seo, Daejeon (KR); Tae-Jin Lee, Daejeon (KR); Kyeong-Ok Kang, Daejeon (KR); Jin-Woong Kim, Daejeon (KR); Chie-Teuk Ahn, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 1057 days.

(21) Appl. No.: 10/692,769

(22) Filed: Oct. 24, 2003

(65) Prior Publication Data

US 2004/0111171 A1 Jun. 10, 2004

(30) Foreign Application Priority Data

Oct. 28, 2002 (KR) ...................... 10-2002-0065918

(51) Int. Cl.
*H03G 3/00* (2006.01)

(52) U.S. Cl. .............................. 381/61; 381/22; 700/94

(58) Field of Classification Search ................... 700/94; 381/17-18, 1, 26, 61, 63, 119, 22-23; 382/154; 704/200.1
See application file for complete search history.

(56) References Cited

U.S. PATENT DOCUMENTS

| | | | | |
|---|---|---|---|---|
| 5,026,051 | A * | 6/1991 | Lowe et al. | 463/35 |
| 5,590,207 | A | 12/1996 | Taylor | |
| 5,768,393 | A * | 6/1998 | Mukojima et al. | 381/17 |
| 5,943,427 | A | 8/1999 | Massie et al. | |
| 6,021,386 | A | 2/2000 | Davis et al. | |
| 6,078,669 | A | 6/2000 | Maher | |
| 6,130,679 | A * | 10/2000 | Chen et al. | 345/473 |
| 6,259,795 | B1 | 7/2001 | McGrath | |
| 6,459,797 | B1 * | 10/2002 | Ashour et al. | 381/18 |

(Continued)

FOREIGN PATENT DOCUMENTS

EP 1061774 12/2000

OTHER PUBLICATIONS

"Using XML Schemas to create and Encode interactive 3-D audio scenes" by Guillaume Potard, Mar. 4, 2002.*

(Continued)

*Primary Examiner*—Vivian Chin
*Assistant Examiner*—Disler Paul
(74) *Attorney, Agent, or Firm*—Blakely, Sokoloff, Taylor & Zafman LLP

(57) ABSTRACT

An object-based 3-D audio system. An audio input unit receives object-based sound sources. An audio editing/producing unit converts the sound sources into 3-D audio scene information. An audio encoding unit encodes 3-D information and object signals of the 3-D audio scene to transmit them through a medium. An audio decoding unit receives the encoded data through the medium, and decodes the same. An audio scene-synthesizing unit selectively synthesizes the object signals and 3-D information into a 3-D audio scene. A user control unit outputs a control signal according to the user's selection so as to selectively synthesize the audio scene by the audio scene synthesizing unit. An audio reproducing unit reproduces the audio scene synthesized by the audio scene-synthesizing unit.

16 Claims, 6 Drawing Sheets

U.S. PATENT DOCUMENTS

| | | | | |
|---|---|---|---|---|
| 6,498,857 | B1 * | 12/2002 | Sibbald | 381/310 |
| 6,704,421 | B1 * | 3/2004 | Kitamura | 381/103 |
| 6,826,282 | B1 * | 11/2004 | Pachet et al. | 381/61 |
| 6,926,282 | B2 * | 8/2005 | Werz et al. | 277/591 |
| 7,133,730 | B1 * | 11/2006 | Katayama et al. | 700/94 |
| 2001/0014621 | A1 * | 8/2001 | Okubo et al. | 463/35 |
| 2001/0055398 | A1 * | 12/2001 | Pachet et al. | 381/80 |
| 2002/0035334 | A1 * | 3/2002 | Meij et al. | 600/509 |
| 2002/0103554 | A1 * | 8/2002 | Coles et al. | 700/94 |
| 2002/0161462 | A1 * | 10/2002 | Fay et al. | 700/94 |
| 2003/0045956 | A1 * | 3/2003 | Comair et al. | 700/94 |
| 2003/0053680 | A1 * | 3/2003 | Lin et al. | 382/154 |
| 2005/0080616 | A1 * | 4/2005 | Leung et al. | 704/200.1 |

OTHER PUBLICATIONS

3D Audio, the Sonic Spot, “3D Audio and Acoustic Environment Modeling”, W. Gardner, 10 pages.

* cited by examiner

OBJECT-BASED THREE-DIMENSIONAL AUDIO SYSTEM AND METHOD OF CONTROLLING THE SAME

CROSS REFERENCE TO RELATED APPLICATION

This application claims priority to and the benefit of Korea Patent Application No. 2002-65918 filed on Oct. 28, 2002 in the Korean Intellectual Property Office, the content of which is incorporated herein by reference.

BACKGROUND OF THE INVENTION (a) Field of the Invention

The present invention relates to an object-based three-dimensional audio system, and a method of controlling the same. More particularly, the present invention relates to an object-based three-dimensional audio system and a method of controlling the same that can maximize audio information transmission, enhance the realism of sound reproduction, and provide services personalized by interaction with users.

(b) Description of the Related Art

Recently, remarkable research and development has been devoted to three-dimensional (hereinafter referred to as 3-D) audio technologies for personal computers. Various sound cards, multi-media loudspeakers, video games, audio software, compact disk read-only memory (CD-ROM), etc. with 3-D functions are on the market.

In addition, a new technology, acoustic environment modeling, has been created by grafting various effects such as reverberation onto the basic 3-D audio technology for simulation of natural audio scenes.

A conventional digital audio spatializing system incorporates accurate synthesis of 3-D audio spatialization cues responsive to a desired simulated location and/or velocity of one or more emitters relative to a sound receiver. This synthesis may also simulate the location of one or more reflective surfaces in the receiver's simulated acoustic environment.

Such a conventional digital audio spatializing system has been disclosed in U.S. Pat. No. 5,943,427, entitled "Method and apparatus for three-dimensional audio spatialization".

In the U.S. '427 patent, 3-D sound emitters output from a digital sound generation system of a computer is synthesized and then spatialized in a digital audio system to produce the impression of spatially distributed sound sources in a given space. Such an impression allows a user to have the realism of sound reproduction in a given space, particularly in a virtual reality game.

However, since the system of the U.S. '427 patent permits a user to listen to the synthesized sound with the virtual realism, it cannot transmit the real audio contents three-dimensionally on the basis of objects, and interaction with a user is impossible. That is, a user may only listen to the sound.

In addition, with respect to U.S. Pat. No. 6,078,669 entitled "Audio spatial localization apparatus and methods," audio spatial localization is accomplished by utilizing input parameters representing the physical and geometrical aspects of a sound source to modify a monophonic representation of the sound or voice and generate a stereo signal which simulates the acoustical effect of the localized sound. The input parameters include location and velocity, and may also include directivity, reverberation, and other aspects. These input parameters are used to generate control parameters that control voice processing.

According to such a conventional computer sound technique, sounds are divided by objects for 'virtual reality' game contents, and a parametric method is employed to process 3-D information and space information so that a virtual space may be produced and interaction with a user is possible. Since all the objects are separately processed, the above conventional technique is applicable to a small amount of synthesized object sounds, and the space information has to be simplified.

However, in order to utilize natural 3-D audio services, the number of object sounds increases, and the space information requires a lot of information for reality.

With respect to Moving Picture Experts Group (MPEG), moving pictures and sounds are encoded on the basis of objects, and additional scene information separated from the moving pictures and sounds is transmitted so that a terminal employing MPEG may provide object-based dialogic services.

However, the above conventional technique is based on virtual sound modeling of computer sounds, and, as described above, in order to apply natural 3-D audio services for broadcasting, cinema, and disc production, as well as disc reproduction, the number of sound objects becomes large, and the various means for encoding each object complicate the system architecture. In addition, the conventional virtual sound modeling architecture is too simple to effectively employ the same in a real acoustic environment.

SUMMARY OF THE INVENTION

It is an object of the present invention to provide an object-based 3-D audio system and a method of controlling the same that optimizes the number of objects of 3-D sounds, and to permit a user to control a reproduction format of respective object sounds according to his or her preference.

In one aspect of the present invention, an object-based three-dimensional (3-D) audio server system comprises: an audio input unit receiving object-based sound sources through various input devices; an audio editing/producing unit separating the sound sources applied through the audio input unit into object sounds and background sounds according to a user's selection, and converting them into 3-D audio scene information; and an audio encoding unit encoding 3-D information and object signals of the 3-D audio scene information converted by the audio editing/producing unit so as to transmit them through a medium.

The audio editing/producing unit includes: a router/audio mixer dividing the sound sources applied in the multi-track format into a plurality of sound source objects and background sounds; a scene editor/producer editing an audio scene and producing the edited audio scene by using 3-D information and spatial information of the sound source objects and background sound objects divided by the router/audio mixer; and a controller providing a user interface so that the scene editor/producer edits an audio scene and produces the edited audio scene under the control of a user.

In another aspect of the present invention, a method of controlling an object-based 3-D audio server system comprises: separating sound source objects from among sound sources applied through various means according to selection by a user; inputting 3-D information for each sound source object separated from the applied sound sources; mixing sound sources other than the separated sound source objects into background sounds; and forming the sound source objects, the 3-D information, and the background sound objects into an audio scene, and encoding and multiplexing the audio scene to transmit the encoded and multiplexed audio signal through a medium.

In still another aspect of the present invention, an object-based three-dimensional audio terminal system comprises: an audio decoding unit demultiplexing and decoding a multiplexed audio signal including object sounds, background sounds, and scene information applied through a medium; an audio scene-synthesizing unit selectively synthesizing the object sounds with the audio scene information decoded by the audio decoding unit into a 3-D audio scene under the control of a user; a user control unit providing a user interface so as to selectively synthesize the audio scene by the audio scene synthesizing unit under the control of the user; and an audio reproducing unit reproducing the 3-D audio scene synthesized by the audio scene-synthesizing unit.

The audio scene-synthesizing unit includes: a sound source object processor receiving the background sound objects, the sound source objects, and the audio scene information decoded by the audio decoding unit to process the sound source objects and audio scene information according to a motion, a relative location between the sound source objects, and a three-dimensional location of the sound source objects, and spatial characteristics under the control of the user; and an object mixer mixing the sound source objects processed by the sound source object processor with the background sound objects decoded by the audio decoding unit to output results.

The audio reproducing unit includes: an acoustic environment equalizer equalizing the acoustic environment between a listener and a reproduction system in order to accurately reproduce the 3-D audio transmitted from the audio scene synthesizing unit; an acoustic environment corrector calculating a coefficient of a filter for the acoustic environment equalizer's equalization, and correcting the equalization by the user; and an audio signal output device outputting a 3-D audio signal equalized by the acoustic environment equalizer.

The user control unit includes an interface that controls each sound source object and the listener's direction and position, and receives the user's control for maintaining realism of sound reproduction in a virtual space to transmit a control signal to each unit.

In still yet another aspect of the present invention, a method of controlling an object-based 3-D audio terminal system comprises: in receiving and outputting an object-based 3-D audio signal, decoding the audio signal applied through a medium and encoded, and dividing the audio signal into object sounds, 3-D information, and background sounds; performing motion processing, group object processing, 3-D sound localization, and 3-D space modeling on the object sounds and the 3-D information to modify and apply the processed object sounds and 3-D information according to a user's selection, and mixing them with the background sounds; and equalizing the mixed audio signal in response to correction of characteristics of the acoustic environment that the user controls, and outputting the equalized signal so that the user may listen to it.

In still yet another aspect of the present invention, an object-based three-dimensional audio system comprises: an audio input unit receiving object-based sound sources through input devices; an audio editing/producing unit separating the sound sources applied through the audio input unit into object sounds and background sounds according to a user's selection, and converting them into three-dimensional audio objects; an audio encoding unit encoding 3-D information of the audio objects and object signals converted by the audio editing/producing unit to transmit them through a medium; an audio decoding unit receiving the audio signal including object sounds and 3-D information encoded by the audio encoding unit through the medium, and decoding the audio signal; an audio scene synthesizing unit selectively synthesizing the object sounds with 3-D information decoded by the audio decoding unit into a 3-D audio scene under the control of a user; a user control unit outputting a control signal according to the user's selection so as to selectively synthesize the audio scene by the audio scene synthesizing unit under the control of the user; and an audio reproducing unit reproducing the audio scene synthesized by the audio scene synthesizing unit.

DETAILED DESCRIPTION OF THE PREFERRED EMBODIMENTS

Figure 1:
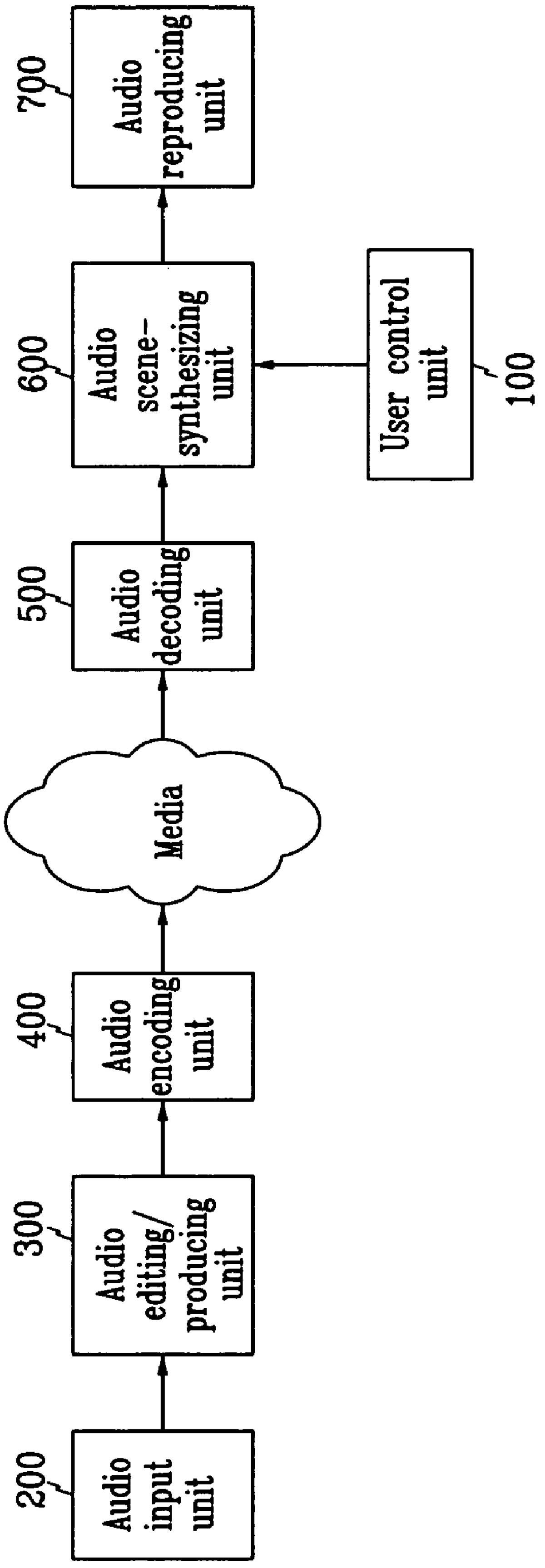
FIG. 1 is a block diagram of an object-based 3-D audio system in accordance with a preferred embodiment of the present invention.

The preferred embodiment of the present invention will now be fully described, referring to the attached drawings. Like reference numerals denote like reference parts throughout the specification and drawings.

FIG. 1 is a block diagram of an object-based 3-D audio system in accordance with a preferred embodiment of the present invention.

Referring to FIG. 1, the object-based 3-D audio system includes a user control unit 100, an audio input unit 200, an audio editing/producing unit 300, an audio encoding unit 400, an audio decoding unit 500, an audio scene-synthesizing unit 600, and an audio reproducing unit 700.

The audio input unit 200, the audio editing/producing unit 300, and the audio encoding unit 400 are included in an input system that receives 3-D sound sources, process them on the basis of objects, and transmits an encoded audio signal through a medium, while the audio decoding unit 500, the audio scene synthesizing unit 600, and the audio reproducing unit 700 are included in an output system that receives the encoded signal through the medium, and outputs object-based 3-D sounds under the control of a user.

Figure 2:
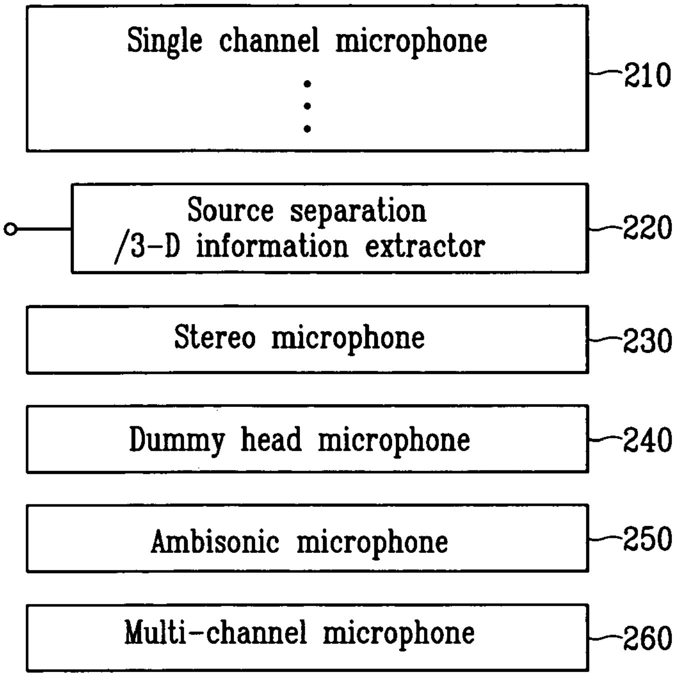
FIG. 2 is a block diagram of an audio input unit of FIG. 1.

The construction of the audio input unit 200 that receives various sound sources in the object-based 3-D input system is depicted in FIG. 2.

Referring to FIG. 2, the audio input unit 200 includes a single channel microphone 210, a stereo microphone 230, a dummy head microphone 240, an ambisonic microphone 250, a multi-channel microphone 260, and a source separation/3-D information extractor 220.

In addition to the microphones depicted in FIG. 2 according to the preferred embodiment of the present invention, the audio input unit 200 may have additional microphones for receiving various audio sound sources.

The single channel microphone 210 is a sound source input device having a single microphone, and the stereo microphone 230 has at least two microphones. The dummy head microphone 240 is a sound source input device whose shape is like a head of a human body, and the ambisonic microphone 250 receives the sound sources after dividing them into signals and volume levels, each moving with a given trajectory on 3-D X, Y, and Z coordinates. The multi-channel microphone 260 is a sound source input device for receiving audio signals of a multi-track.

The source separation/3-D information extractor 220 separates the sound sources that have been applied from the above sound source input devices by objects, and extracts 3-D information.

The audio input unit 200 separates sounds that have been applied from the various microphones into a plurality of object signals, and extracts 3-D information from the respective object sounds to transmit the 3-D information to the audio editing/producing unit 300.

The audio editing/producing unit 300 produces given object sounds, background sounds, and audio scene information under the control of a user by using the input object signals and 3-D information.

Figure 3:
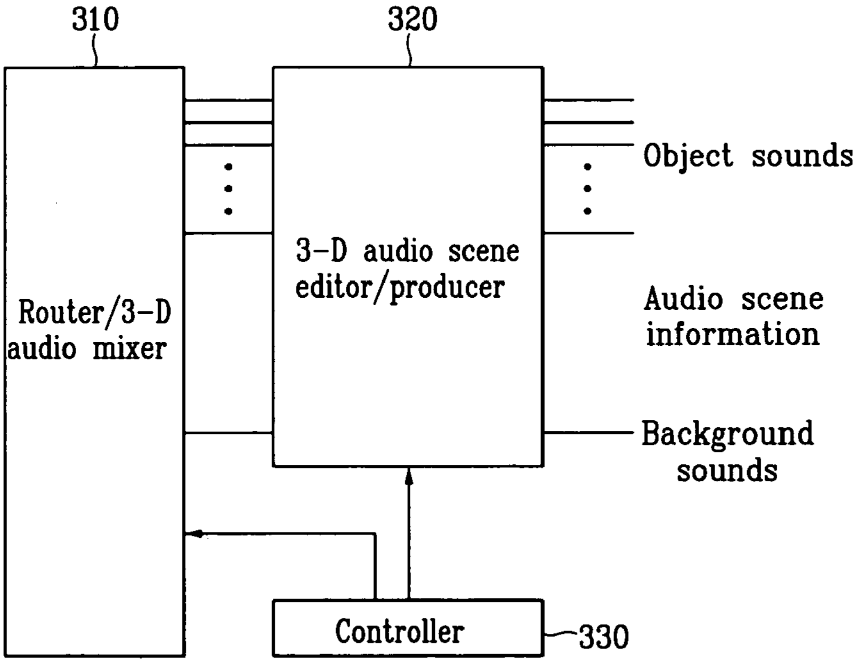
FIG. 3 is a block diagram of an audio editing/producing unit of FIG. 1.

FIG. 3 is a block diagram of the audio editing/producing unit 300 of FIG. 1 according to the preferred embodiment of the present invention.

Referring to FIG. 3, the audio editing/producing unit 300 includes a router/3-D audio mixer 310, a 3-D audio scene editor/producer 320, and a controller 330.

The router/3-D audio mixer 310 divides the object information and 3-D information that have been applied from the audio input unit 200 into a plurality of object sounds and background sounds according to a user's selection.

The 3-D audio scene editor/producer 320 edits audio scene information of the object sounds and background sounds that have been divided by the router/3-D audio mixer 310 under the control of the user, and produces edited audio scene information.

The controller 330 controls the router/3-D audio mixer 310 and the 3-D audio scene editor/producer 320 to select 3-D objects from among them, and controls audio scene editing.

The router/3-d audio mixer 310 of the audio editing/producing unit 300 divides the audio object information and 3-D information that have been applied from the audio input unit 200 into a plurality of object sounds and background sounds according to the user's selection to produce them, and processes the other audio object information that has not been selected into background sound. In this instance, the user may select object sounds through the controller 330.

The 3-D audio scene editor/producer 320 forms a 3-D audio scene by using the 3-D information, and the controller 330 controls a distance between the sound sources or relationship of the sound sources and background sounds by a user's selection to edit/produce the 3-D audio scene.

The edited/produced audio scene information, the object sounds, and the background sound information are transmitted to the audio encoding unit 400 and converted by the audio encoding unit 400 to be transmitted through a medium.

Figure 4:
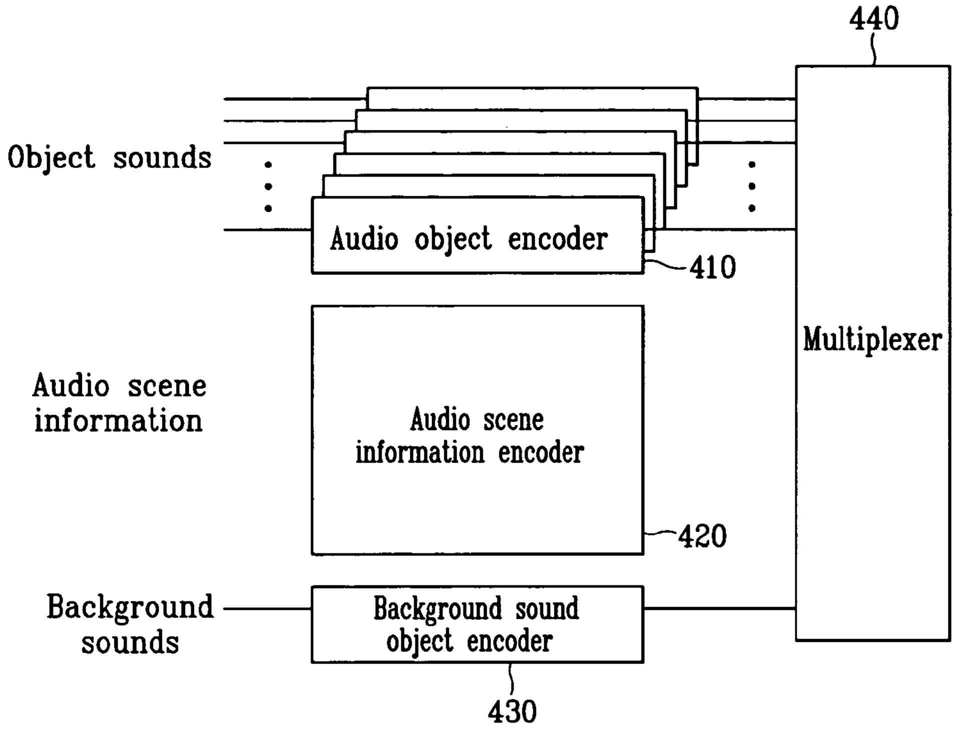
FIG. 4 is a block diagram of an audio encoding unit of FIG. 1.

FIG. 4 is a block diagram of the audio encoding unit 400 of FIG. 1 according to the preferred embodiment of the present invention.

Referring to FIG. 4, the audio encoding unit 400 includes an audio-object encoder 410, an audio scene information encoder 420, a background-sound encoder 430, and a multiplexer 440.

The audio object encoder 410 encodes the object sounds transmitted from the audio editing/producing unit 300, and the audio scene information encoder 420 encodes the audio scene information. The background sound encoder 430 encodes the background sounds. The multiplexer 440 multiplexes the object sounds, the audio scene information, and the background sounds respectively encoded by the audio object encoder 410, the audio scene information encoder 420, and the background sound encoder 430 in order to transmit the same as a single audio signal.

As described above, the object-based 3-D audio signal is transmitted via a medium, and a user may input and transmit sound sources, considering his or her purpose of listening to the audio signal, and his or her characteristics and acoustic environment.

The following description concerns an object-based 3-D audio output system that receives the audio signal and outputs it.

In order to receive the audio signal transmitted through the medium and provide the same to a listener, the audio decoding unit 500 of the 3-D audio output system first decodes the input audio signal.

Figure 5:
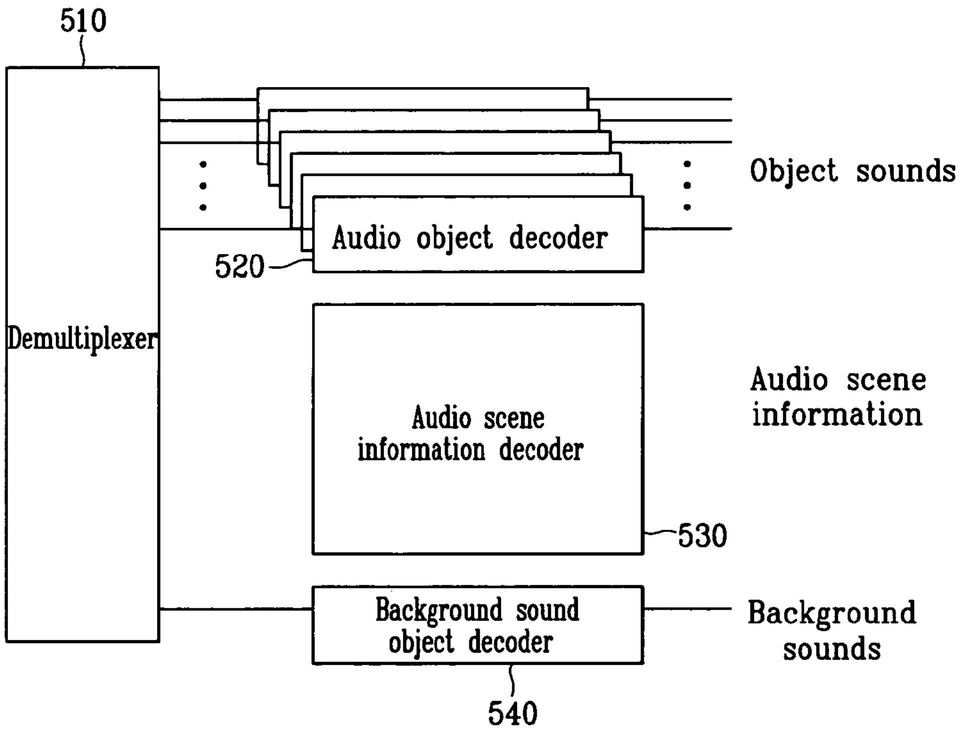
FIG. 5 is a block diagram of an audio decoding unit of FIG. 1.

FIG. 5 is a block diagram of the audio decoding unit 500 of FIG. 1 according to the preferred embodiment of the present invention.

Referring to FIG. 5, the audio decoding unit 500 includes a demultiplexer 510, an audio object decoder 520, an audio scene information decoder 530, and a background sound object decoder 540.

The demultiplexer 510 demultiplexes the audio signal applied through the medium, and separates the same into object sounds, scene information and background sounds.

The audio object decoder 520 decodes the object sounds separated from the audio signal by the demultiplexing, and the audio scene information decoder 530 decodes the audio scene information. The background sound object decoder 540 decodes the background sounds.

The audio scene-synthesizing unit 600 synthesizes the object sounds, the audio scene information, and the background sounds decoded by the audio decoding unit 500 into a 3-D audio scene.

Figure 6:
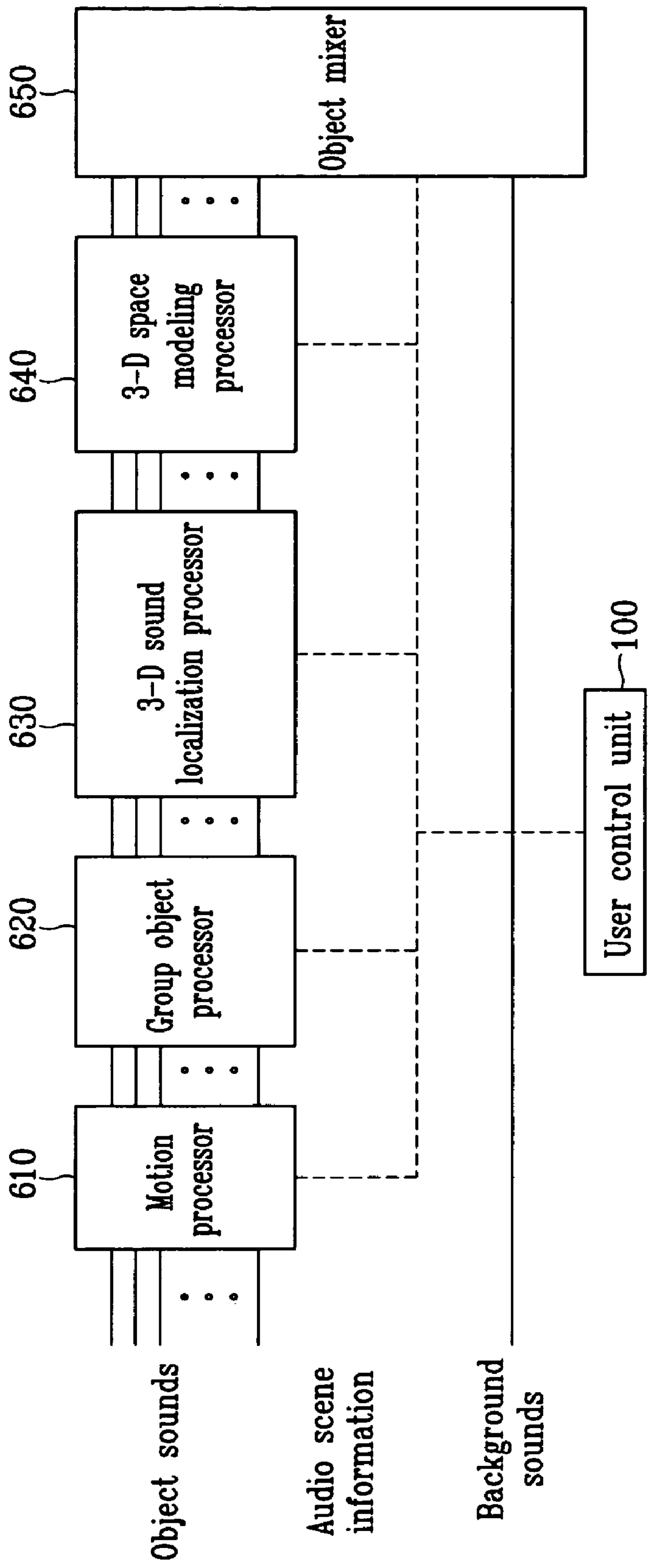
FIG. 6 is a block diagram of an audio scene-synthesizing unit of FIG. 1.

FIG. 6 is a block diagram of the audio scene-synthesizing unit 600 of FIG. 1 according to the preferred embodiment of the present invention.

Referring to FIG. 6, the audio scene-synthesizing unit 600 includes a motion processor 610, a group object processor 620, a 3-D sound image localization processor 630, a 3-D space modeling processor 640, and an object mixer 650.

The motion processor 610 successively updates location coordinates of each object sound moving with a particular trajectory and velocity relative to a listener, and when there is the listener's control, the group object processor 620 updates location coordinates of a plurality of sound sources relative to the listener in a group according to his or her control.

The 3-D sound image localization processor 630 has different functions according to a reproduction environment, i.e., the configuration and arrangement of loudspeakers. When two loudspeakers are used for sound reproduction, the 3-D sound image localization processor 630 employs a head related transfer function (HRTF) to perform sound image localization, and in the case of using a multi-channel microphone, the 3-D sound image localization processor 630 performs the sound image localization by processing the phase and level of loudspeakers.

The 3-D space modeling processor 640 reproduces spatial effects in response to the size, shape, and characteristics of an acoustic space included in the 3-D information, and individually processes the respective sound sources.

In this instance, the motion processor 610, the group object processor 620, the 3-D sound image localization processor 630, and the 3-D space modeling processor 640 may be under the control of a user through the user control unit 100, and the user may control processing of each object and space processing.

The object mixer 650 mixes the objects and background sounds respectively processed by the motion processor 610, the group object processor 620, the 3-D sound image localization processor 630, and the 3-D space modeling processor 640 to output them to a given channel.

The audio scene-synthesizing unit 600 naturally reproduces the 3-D audio scene produced by the audio editing/producing unit 300 of the audio input system. In case of need, the user control unit 100 controls 3-D information parameters of the space information and object sounds to allow a user to change 3-D effects.

The audio reproducing unit 700 reproduces an audio signal that the audio scene-synthesizing unit 600 has transmitted after processing and mixing the object sounds, the background sounds, and the audio scene information with each other so that a user may listen to it.

Figure 7:
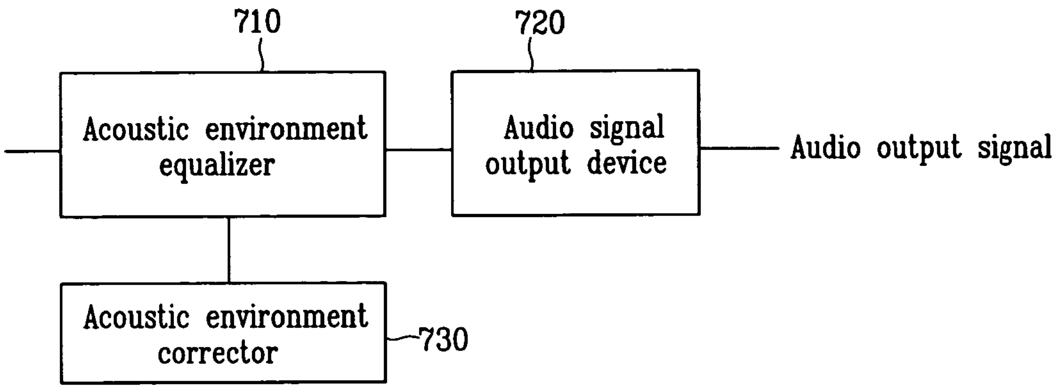
FIG. 7 is a block diagram of an audio reproducing unit of FIG. 1.

FIG. 7 is a block diagram of the audio reproducing unit 700 of FIG. 1 according to the preferred embodiment of the present invention.

The audio reproducing unit 700 includes an acoustic environment equalizer 710, an audio signal output device 720, and an acoustic environment corrector 730.

The acoustic environment equalizer 710 applies an acoustic environment in which a user is going to listen to sounds at the final stage to equalize the acoustic environment.

The audio signal output device 720 outputs an audio signal so that a user may listen to the same.

The acoustic environment corrector 730 controls the acoustic environment equalizer 710 under the user's control, and corrects characteristics of the acoustic environment to accurately transmit signals, each output through the speakers of the respective channels, to the user.

More specifically, the acoustic environment equalizer 710 normalizes and equalizes characteristics of the reproduction system so as to more accurately reproduce 3-D audio signals synthesized in response to the architecture of loudspeakers, characteristics of the equipment, and characteristics of the acoustic environment. In this instance, in order to exactly transmit desired signals and output them through the speakers of the respective channels to a listener, the acoustic environment corrector 730 includes an acoustic environment correction and user control device.

The characteristics of the acoustic environment may be corrected by using a crosstalk cancellation scheme when reproducing audio signals in binaural stereo. In the case of using a multi-channel microphone, characteristics of the acoustic environment may be corrected by controlling the level and delay of each channel.

In the object-based 3-D audio output system, the user control unit 100 either corrects the space information of the 3-D audio scene through a user interface to control sound effects, or controls 3-D information parameters of the object sounds to control the location and motion of the object sounds.

In this instance, a user may properly form the 3-D audio information into a desired 3-D audio scene, monitoring the presently controlled situation by using the audio-visual information, or may reproduce only a special object or cancel the reproduction.

According to the preferred embodiment of the present invention, the object-based 3-D audio system provides the user interface by using 3-D audio information parameters to allow the blind with a normal sense of hearing to control an audio/video system, and more definitely controls the acoustic impression on the reproduced scene, thereby enhancing the understanding of the scene.

The object-based 3-D audio system of the present invention permits a user to appreciate a scene at a different angle and on a different position with video information, and may be applied to foreign language study. In addition, the present invention may provide users with various control functions such as picking out and listening to only the sound of a certain musical instrument when listening to a musical performance, e.g., a violin concerto.

The method of controlling the object-based 3-D audio system will now be described in detail.

Figure 8:
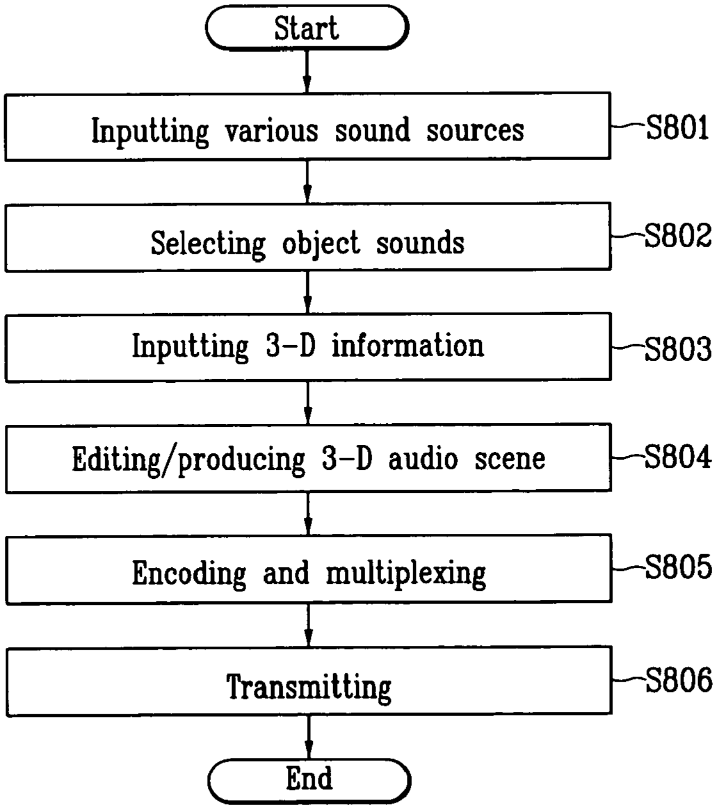
FIG. 8 depicts a flow chart describing the steps of controlling an object-based 3-D audio server system in accordance with the preferred embodiment of the present invention.

FIG. 8 depicts a flow chart describing the steps of controlling an object-based 3-D audio server system in accordance with the preferred embodiment of the present invention Referring to FIG. 8, when various sound sources are applied to the system through a plurality of microphones (S801), a user selects object sounds from among the input sound sources (S802), and inputs 3-D information for each object sound (S803) to the system.

The user properly controls the object sounds and 3-D information and selects the object sounds, considering the purpose of using them, his or her characteristics, and characteristics of the acoustic environment. The other sound sources that the user has not selected as object sounds are processed into background sounds. By way of example, a speaker's voice may be selected as object sounds from among sound sources, so as to allow a listener to carefully listen to the native speaker's pronunciation. The other sound sources that the listener has not selected are processed into background sounds. In this manner, the listener may select only the native speaker's voice and pronunciation as object sounds while excluding other background sounds, to use the native speaker's pronunciation for foreign language study.

The audio scene editing/producing unit 300 edits and produces the object sounds, the 3-D information, and the background sounds that have been controlled in the steps S802 and S803 into a 3-D audio scene (S804), and the audio encoding unit 400 respectively encodes and multiplexes the object sounds, the audio scene information, and the background sounds (S805) to transmit them through a medium (S806).

The following description is about the method of receiving audio data transmitted as object-based 3-D sounds, and reproducing the same.

Figure 9:
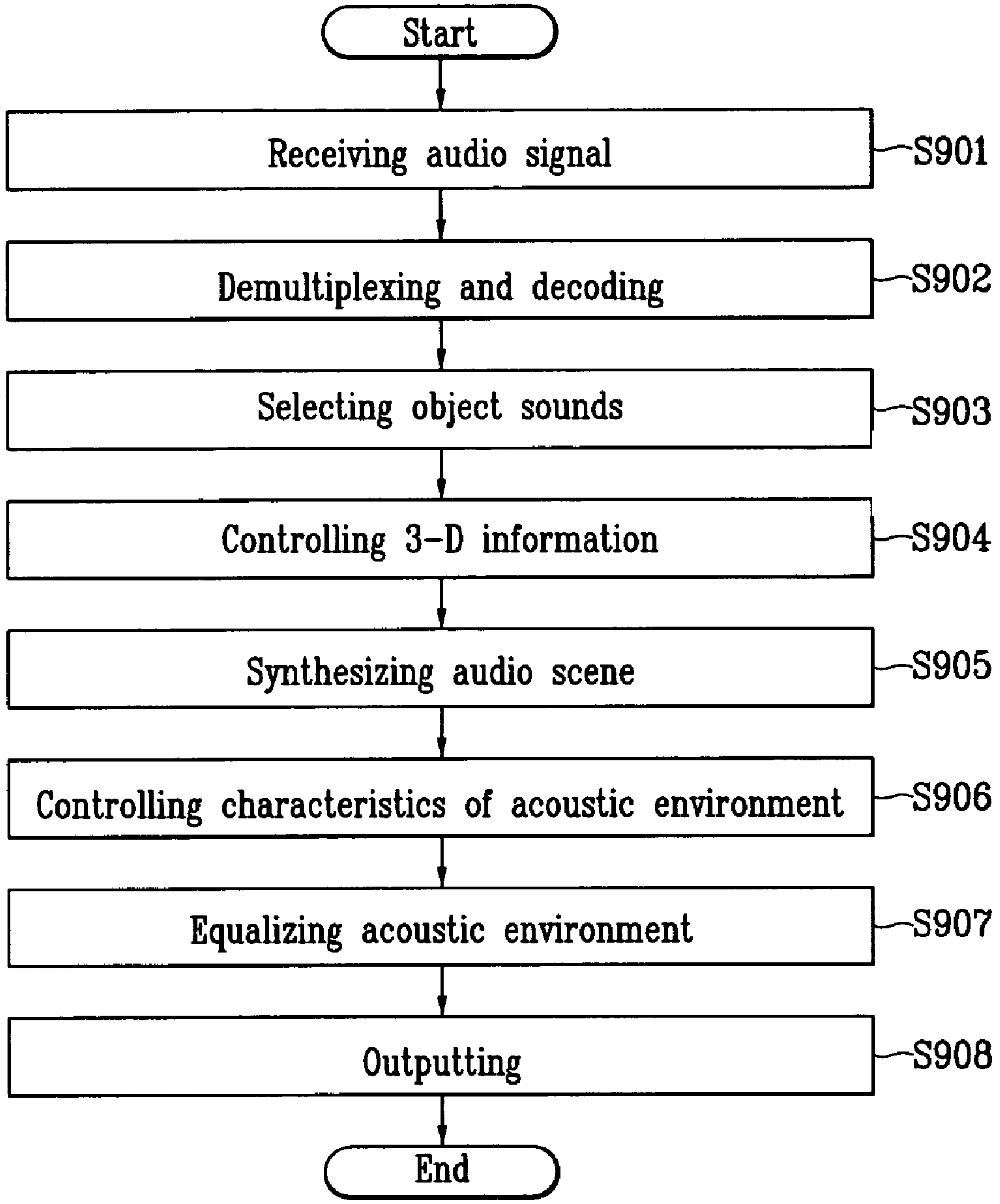
FIG. 9 depicts a flow chart describing the steps of controlling an object-based 3-D audio terminal system in accordance with the preferred embodiment of the present invention.

FIG. 9 depicts a flow chart describing the steps of controlling an object-based 3-D audio terminal system in accordance with the preferred embodiment of the present invention.

Referring to FIG. 9, when audio signals are applied through the medium to the audio decoding unit 500 (S901), the audio decoding unit 500 demultiplexes the input audio signals to separate them into object sounds, audio scene information, and background sounds, and decodes each of them (S902).

The audio scene-synthesizing unit 600 synthesizes the decoded object sounds, audio scene information, and background sounds into a 3-D audio scene. In this instance, a listener may select object sounds according to his or her purpose of listening, and may either keep or remove the selected object sounds or control the volume of the object sounds (S903).

In the step S903 of processing each object sound into an audio signal by the audio scene-synthesizing unit 600, the user controls the 3-D information through the user control unit 100 (S904) to enhance the stereophonic sounds or produce special effects in response to an acoustic environment.

As described above, when the user has selected the object sounds and controlled the 3-D information through the user control unit 100, the audio scene synthesizing unit 600 synthesizes them into an audio scene with background sounds (S905), and the user controls the acoustic environment corrector 730 of the audio reproducing unit 700 to modify or input the acoustic environment information in response to the characteristics of the acoustic environment (S906).

The acoustic environment equalizer 710 of the audio system equalizes audio signals that have been output in response to the acoustic environment's characteristics under the user's control (S907), and the audio reproducing unit 700 reproduces them through loudspeakers (S908) so as to let the user listen to them.

As described above, since the audio input/output system of the present invention allows a user to select an object of each sound source and arbitrarily input 3-D information to the system, it may be controlled in response to the functions of audio signals and a human listener's acoustic environment. Thus, the present invention may produce more dramatic audio effects or special effects and enhance the realism of sound reproduction by modifying the 3-D information and controlling the characteristics of the acoustic environment.

In conclusion, according to the object-based 3-D audio system and the method of controlling the same, a user may control the selection of sound sources based on objects and edit the 3-D information in response to his or her purpose of listening and characteristics of an acoustic environment so that he or she can selectively listen to desired audio. In addition, the present invention can enhance the realism of sound production and produce special effects.

While the present invention has been described in connection with what is considered to be the preferred embodiment, it is to be understood that the present invention is not limited to the disclosed embodiments, but, on the contrary, is intended to cover various modification and equivalent arrangements included within the spirit and scope of the appended claims.

What is claimed is:

1. An object-based three-dimensional audio terminal system comprising:

an audio decoding unit demultiplexing and decoding a multiplexed audio signal including object sounds, background sounds, and scene information applied through a medium wherein the audio decoding unit comprises a demultiplexer for demultiplexing data applied through the medium and multiplexed to separate them into background sound object data, sound source data, and audio scene information data and a decoder for decoding the background sound object data, the sound source data, and the audio scene information data separated by the demultiplexer;

an audio scene-synthesizing unit selectively synthesizing the object sounds with the audio scene information decoded by the audio decoding unit into a 3-D audio scene under the control of a user, the audio scene-synthesizing unit including a sound source object processor for receiving the background sound objects, the sound source objects and the audio scene information data and an object mixer for mixing the sound source objects processed by the sound source object processor with the background sound objects decoded by the audio decoding unit to output the results;

a user control unit providing a user interface so as to selectively synthesize the audio scene by the audio scene synthesizing unit under the control of the user, wherein the sound source object processor further includes a motion processor analyzing a plurality of sound source data and the audio scene information, calculating a location of each sound source object moving with its particular trajectory, and modifying its trajectory under the control of the user through the user control unit; and an audio reproducing unit reproducing the 3-D audio scene synthesized by the audio scene-synthesizing unit.

2. The system according to claim 1, wherein the sound source object processor receives the background sound objects, the sound source objects, and the audio scene information decoded by the audio decoding unit to process the sound source objects and audio scene information according to a motion, a relative location between the sound source objects, and a three-dimensional location of the sound source objects, and spatial characteristics under the control of the user.

3. The system according to claim 1, wherein the sound source object processor further includes:

a group object processor calculating a relative location of the respective sound source objects when a plurality of the sound source objects is grouped, and controlling the relative location of the sound source objects under the control of the user through the user control unit;

a 3-D sound localization processor providing each sound source object having a location defined on 3-D coordinates with directivity in response to a listener's location under the control of the user control unit; and a 3-D space modeling processor providing a sense of closeness and remoteness and spatial effects to each sound source object according to characteristics of a 3-D space.

4. The system according to claim 1, wherein the audio reproducing unit includes:

an acoustic environment equalizer equalizing the acoustic environment between a listener and a reproduction system in order to accurately reproduce the 3-D audio transmitted from the audio scene synthesizing unit;

an acoustic environment corrector calculating a coefficient of a filter for the acoustic environment equalizer's equalization, and correcting the equalization by the user; and an audio signal output device outputting a 3-D audio signal equalized by the acoustic environment equalizer.

5. The system according to claim 4, wherein the acoustic environment equalizer further includes:

means for equalizing the environmental characteristics between the listener and the audio terminal system in order to accurately reproduce 3-D audio;

means for canceling crosstalk transmitted to right and left ears of the listener; and means for correcting the characteristics of the acoustic environment automatically or in response to the user's input, according to the information on speakers of the audio system, a listening room's construction, and arrangement of the speakers, transmitted from the acoustic environment corrector.

6. The system according to claim 1, wherein the user control unit includes an interface that controls each sound source object and the listener's direction and position, and receives the user's control for maintaining realism of sound reproduction in a virtual space to transmit a control signal to each unit.

7. A method of controlling an object-based 3-D audio terminal system comprising:

in receiving and outputting an object-based 3-D audio signal, decoding the audio signal applied through a medium, and dividing the audio signal into object sounds, 3-D information, and background sounds;

performing motion processing, group object processing, 3-D sound localization, and 3-D space modeling on the object sounds and the 3-D information to modify and apply the processed object sounds and 3-D information according to a user's selection, and mixing them with the background sounds, wherein motion processing includes analyzing a plurality of object sounds and the 3-D information, calculating a location of each of the object sounds moving with its particular trajectory, and modifying its trajectory according to the user's selection; and equalizing the mixed audio signal in response to correction of characteristics of the acoustic environment that the user controls, and outputting the equalized signal.

8. The method according to claim 7, wherein synthesizing the audio scene further includes:

processing a motion effect of each object moving with a particular trajectory, in response to a control signal output from a user control unit;

grouping the object, and calculating and processing a relative location of each grouped object;

processing 3-D sound localization by providing each sound source object having a location defined on 3-D coordinates with directivity in response to a listener's position;

processing 3-D space modeling by providing the object with a sense of closeness and remoteness and spatial effects according to characteristics of a 3-D space; and mixing the processed sound source object with the background sound object to synthesize a 3-D audio scene.

9. The method according to claim 7, wherein outputting the audio scene further includes:

equalizing the 3-D audio output according to information on characteristics of the acoustic environment between a listener and the audio system, and information on correcting the acoustic environment applied by the user; and outputting the equalized 3-D audio scene to provide the same to the listener.

10. An object-based three-dimensional audio system comprising:

an audio input unit receiving object-based sound sources through input devices;

an audio editing/producing unit separating the sound sources applied through the audio input unit into object sounds and background sounds according to a user's selection, and converting them into three-dimensional audio objects;

an audio encoding unit encoding 3-D information of the audio objects and object signals converted by the audio editing/producing unit to transmit them through a medium;

an audio decoding unit receiving the audio signal including object sounds and 3-D information encoded by the audio encoding unit through the medium, and decoding the audio signal;

an audio scene synthesizing unit selectively synthesizing the object sounds with 3-D information decoded by the audio decoding unit into a 3-D audio scene under the control of a user;

a motion processor analyzing a plurality of the sound sources and the 3-D audio scene, calculating a location of each sound source moving with its particular trajectory, and modifying its trajectory under the control of the user;

a user control unit outputting a control signal according to the user's selection so as to selectively synthesize the audio scene by the audio scene synthesizing unit under the control of the user; and an audio reproducing unit reproducing the audio scene synthesized by the audio scene synthesizing unit.

11. The system according to claim 10, wherein the audio input unit includes:

a combination of sound source input devices having:

a single channel microphone with a single microphone;

a stereo microphone with at least two microphones;

a dummy head microphone whose shape is like a head of a human body;

an ambisonic microphone receiving the sound sources after dividing them into signals and volume levels, each moving with a given trajectory on 3-D X, Y, and Z coordinates; and a multi-channel microphone receiving multitrack audio signals; and a source separation/3-D information extractor separating the sound sources applied from the combination of the sound source input devices by objects, and extracting 3-D information.

12. The system according to claim 10, wherein the audio editing/producing unit includes:

a router/audio mixer dividing the sound sources applied in the multi-track format into a plurality of sound source objects and background sounds;

a scene editor/producer editing an audio scene and producing the edited audio scene by using 3-D information and spatial information of the sound source objects and background sound objects divided by the router/audio mixer; and a controller providing a user interface so that the scene editor/producer edits an audio scene and produces the edited audio scene under the control of a user.

13. The system according to claim 10, wherein the audio encoding unit includes:

a data encoding block encoding each set of data divided into background sound objects, sound source objects, and audio scene information output from the audio editing/producing unit; and a multiplexer multiplexing object data of the background sound, data of the sound sources, and data of the audio scene information encoded by the data encoding block into a single signal, and transmitting the same.

14. The system according to claim 13, wherein the data encoding block includes:

an audio object encoder encoding the sound objects;

an audio scene information encoder encoding the audio scene information; and a background sound object encoder encoding the background sounds.

15. A method of controlling an object-based 3-D audio terminal system, comprising:

separating sound source objects from among sound sources according to a selection by a user;

inputting 3-D information on the separated sound source objects;

processing sound sources other than the input sound source objects and 3-D information as background sounds;

forming the sound source objects, the 3-D information, and the background sounds into an audio scene, and encoding and multiplexing the audio scene to transmit the encoded and multiplexed audio scene through a medium;

decoding the audio signal applied through a medium, and dividing the audio signal into object sounds, 3-D information, and background sounds; performing motion processing, group object processing, 3-D sound localization, and 3-D space modeling with respect to the object sounds and the 3-D information to modify and apply the processed object sounds and 3-D information according to a user's selection, and mixing them with the background sounds, wherein motion processing includes analyzing a plurality of sound sources and the 3-D information, calculating a location of each of the sound sources moving with its particular trajectory, and modifying its trajectory according to the user's selection; and equalizing the mixed audio signal in response to correction of characteristics of the acoustic environment that the user controls, and outputting the equalized audio signal.

16. The method according to claim 15, wherein each of the sound source objects further includes 3-D information for a relative sound source object by grouping the sound source objects that have to be controlled by groups.

* * * * *